United States Patent
Reynes et al.

(10) Patent No.: US 7,432,145 B2
(45) Date of Patent: Oct. 7, 2008

(54) POWER SEMICONDUCTOR DEVICE WITH A BASE REGION AND METHOD OF MANUFACTURING SAME

(75) Inventors: Jean-Michel Reynes, Pompertuzat (FR); Ivana Deram, Colomiers (FR); Adeline Feybesse, Blagnac (FR)

(73) Assignee: Freescale Semiconductor, Inc., Austin, TX (US)

( * ) Notice: Subject to any disclaimer, the term of this patent is extended or adjusted under 35 U.S.C. 154(b) by 277 days.

(21) Appl. No.: 10/518,158

(22) PCT Filed: Jun. 10, 2003

(86) PCT No.: PCT/EP03/06117

§ 371 (c)(1),
(2), (4) Date: Dec. 10, 2004

(87) PCT Pub. No.: WO03/107432

PCT Pub. Date: Dec. 24, 2003

(65) Prior Publication Data

US 2006/0145252 A1    Jul. 6, 2006

(30) Foreign Application Priority Data

Jun. 12, 2002    (EP) .................................. 02291458

(51) Int. Cl.
*H01L 21/337* (2006.01)

(52) U.S. Cl. ........................ 438/193; 438/195; 438/212; 438/268; 257/263; 257/342; 257/E29.257

(58) Field of Classification Search ................. 257/342, 257/263, E29.257; 438/193, 195, 212, 268
See application file for complete search history.

(56) References Cited

U.S. PATENT DOCUMENTS

| 4,651,181 | A | * | 3/1987 | David ........................ 257/342 |
| 5,399,892 | A | | 3/1995 | Neilson |
| 5,521,410 | A | * | 5/1996 | Yamamoto .................. 257/342 |
| 5,631,484 | A | * | 5/1997 | Tsoi et al. ................... 257/327 |
| 5,703,389 | A | * | 12/1997 | Knoch et al. ................ 257/327 |

FOREIGN PATENT DOCUMENTS

JP            01238173           9/1989

* cited by examiner

*Primary Examiner*—Howard Weiss
*Assistant Examiner*—John C Ingham

(57) ABSTRACT

A low on-state resistance power semiconductor device has a shape and an arrangement that increase the channel density and the breakdown voltage The power semiconductor device comprises a plurality of individual cells formed on a semiconductor substrate (62). Each individual cell comprises a plurality of radially extending branches (80) having source regions (37) within base regions (36). The plurality of individual cells are arranged such that at least one branch of each cell extends towards at least one branch of an adjacent cell and wherein the base region (36) of the extending branches merge together to form a single and substantially uniformly doped base region (36) surrounding drain islands (39) at the surface of the semiconductor substrate (62).

7 Claims, 3 Drawing Sheets

POWER SEMICONDUCTOR DEVICE WITH A BASE REGION AND METHOD OF MANUFACTURING SAME

FIELD OF THE INVENTION

The invention relates, in general, to semiconductor processing techniques and more particularly to a power semiconductor device with a single continuous base region and method therefor.

BACKGROUND OF THE INVENTION

Semiconductor devices such as MOSFETs (Metal Oxide Semiconductor Field Effect Transistors) have been used in power electronics applications due to their appreciable current carrying and off-state voltage blocking capability with low on-state voltage drop. In terms of industrial applications, Power MOSFET devices are commonly used in many electronics fields such as portable electronics, power supplies, telecommunications and more particularly in many industrial applications relating to automotive electronics.

Conventionally, a power MOSFET has a vertical oriented four-layer structure of alternating p-type and n-type doping. For instance, the n+pn-n+ structure is termed enhancement mode n-channel MOSFET. By applying a voltage higher than a threshold level, which biases the gate positive with respect to the source, an n-type inversion layer or channel will be formed under the gate oxide layer thus forming a connecting layer between the source and the drain regions and allowing a current to flow. Once the device is turned on, the relation between the current and the voltage is nearly linear which means that it behaves like a resistance. The resistance is referred to as the on-state resistance.

High cell density vertical insulated gate FET (IGFET) are preferred because of their low on-state resistance per unit area compared to standard density insulated gate FET devices (typically in the order of 155,000 cells/cm$^2$). Their lower on-state resistance provides higher current capability.

Different high cell density vertical IGFET configurations already exist. U.S. Pat. No. 6,144,067 describes a power MOSgated device with a strip gate poly structure to increase channel width while reducing the gate resistance. As is shown in FIG. 1, the cell structure (102) disclosed therein consists of a base having two narrow oppositely directed extensions (100) from a central laterally enlarged contact section (101). Each cell has connections between strips and longer sections of strips that are closely spaced and wherein these closely spaced strips are employed to reduce the $R_{DSON}$ of a given die. This "Stripe Cell" combination provides a higher breakdown voltage behaviour from the Stripe layout and a reduced $R_{DSON}$ from the Cell layout. However, the $R_{DSON}$ though reduced can still be improved with the increased channel density.

In two other international patent applications WO 01/31711 and WO 01/31709, a semiconductor device uses a single continuous base region (140) with an undulating structure (180) as is shown in FIG. 2. Both devices implement a single well region made by a layout where either the gate layer (134) substantially surrounds the base region (140), or the base region, which is composed of a plurality of branches, substantially surrounds the gate layer of the transistor. By using this undulating structure (180) of the base region, the channel density is improved and thus on-state resistance can be lowered. However, by using another type of structure of the base region which does not require the use of gate feeds that link groups of cells to each other, it is possible to increase the channel density and to lower the on-state resistance as will be shown in the present invention.

U.S. Pat. No. 5,703,389 relating to a vertical IGFET configuration having low on-state resistance describes a stripe configuration or arrangement wherein the stripe regions (31) have a non linear shape that leads to an increase of the channel density as shown in FIG. 3. Those non-linear stripes also improve breakdown voltage characteristics not only compared to individual cell design, which is another type of IGFET configuration, but also compared to IGFET configuration with straight stripes design. As a matter of fact, non-linear stripe configuration according to U.S. Pat. No. 5,703,389 provides a cell density on an order of 1.4 million cells/cm$^2$ and an on-state resistance that is on the order of 25% lower than typical individual cell designs and 35% lower than typical straight or linear stripe designs. Conversely, straight stripe arrangement has a cell density on an order of 700,000 cells/cm$^2$, lower than the cell density of the individual cell configuration which is on an order of 930,000 cells/cm$^2$, and therefore has a breakdown voltage that is 10%-15% higher than individual cell arrangement. A lower cell density results in lower channel density and contributes therefore to higher on-state resistance in IGFET devices.

Other examples of power semiconductor devices are described in U.S. Pat. Nos. 4,823,176 and 5,399,892 and Japanese patent specification 01 238173.

According to the above-mentioned prior art, the notion of cell density is assimilated to the notion of channel density. As a matter of fact, the channel density should be defined as the ratio between the perimeter of the source region and the surface of the cell active area. Usually, the lower the size of the cells, the higher is the ratio, and thus the channel density. Therefore, many improvements of the MOSFET devices consist in reducing the size of the cell region. However, beyond a certain limit the ratio is decreased and the channel density reduced.

These different configurations aim at increasing the channel density thereby providing a vertical IGFET having a low on-state resistance.

A second problem that is pertaining to the problem of increasing the channel density is the improvement of the breakdown voltage. As in the case of some of the previously mentioned patents, the present invention also addresses this breakdown voltage problem.

Typically, the manufacturing of a MOSFET device needs to address the electrical isolation issue so that each base cell region is electrically isolated in an epitaxial layer. Ideally, all base regions should be at the same electrical potential in order to get a good snap back immunity while improving the breakdown voltage, likewise increasing the unclamped inductive switching (referred to as UIS) capability.

Because of the required minimum optical base cell shrinking process for lowering $R_{DSON}$, it is not so straightforward to manufacture uniform cell structures across the entire MOSFET. Consequently, during the OFF state, and at lower current density, the snap back phenomenon can take place, which dramatically reduces the breakdown voltage behaviour. However, even if the breakdown voltage yield is impacted which consequently increases the final manufacturing cost, the reliability of the tested good devices is not fully guaranteed. There is a risk of transistor failure for higher current density caused by the base cells during UIS testing.

UIS behaviour is associated with a parasitic NPN bipolar transistor phenomenon which appears in the source/body/drain structure. It is common practice to measure the ruggedness of a MOSFET device by characterizing its UIS behaviour. Therefore, in order to reduce the risk of transistor failure during momentary overloads, improvements should be implemented in the Power MOSFET design to enable to dissipate energy while operating in the avalanche condition. However even if the P+ Body region is doped and located close to the beginning of the channel in such a way that the body resistor is dramatically reduced and provides a good immunity against a drop in tension which could activate the parasitic bipolar transistor, and lead to the device failure, it is still necessary to make sure that all individual cells structure are uniform within the entire MOSFET device.

Therefore, a need exists for a power semiconductor device that provides an improved channel density, while not degrading its breakdown voltage, and having a good electrical contact to a unique base region so as to guarantee the high energy capability (UIS).

In term of method for manufacturing a semiconductor device, in a conventional power MOSFET process, photo-masking steps are required to produce a device. These steps include an active-area masking step where a thick field oxide region is left around the periphery of the device, 1 or 2 optional masking steps to provide a polysilicon temperature sensing device, a base masking step, a first blocking mask for forming the source regions, a contact mask, a metal mask and an optional final passivation mask.

It is far from straightforward to reduce the number of masking steps which can be used for every type of configuration. One has to adopt the manufacturing process according to the type of configuration of the cells. In the present case, the manufacturing process has to deal with the step of merging the body cells that will be described in more detail below.

SUMMARY OF THE INVENTION

In accordance with the present invention, there is provided a power semiconductor device as recited in the accompanying claims.

In one embodiment, the invention described herein relates to an IGFET semiconductor wherein each individual cell has at least three radially extending branches arranged in such a way that the area defined by the merging adjacent branches is a polygon.

In other embodiments, the power IGFET device is composed of individual cells which have four or six radially extending branches arranged in such a way that the areas defined by the merging adjacent branches are respectively a square or a triangle.

Preferably, the power IGFET device is formed with individual cells having a plurality of sources regions separating said physically isolated drain regions such that these individual cells are packed into a relatively small area to contain at least 10 physically isolated drain cells to improve the channel density of the device.

According to another aspect of the present invention, there is provided a method for manufacturing power semiconductor devices as recited in the accompanying claims Preferably, according to the present invention, the method of manufacturing power semiconductor devices further comprising the step of merging said base regions of each individual cell so as to form a single base region.

Embodiments of the invention will now be described by way of example only, with reference to the accompanying drawing.

BRIEF DESCRIPTION OF THE DRAWINGS

The foregoing and other objects and advantages of the invention will be appreciated more fully from the following further description thereof, with reference to the accompanying drawings, wherein.

DETAILED DESCRIPTION OF THE PREFERRED EMBODIMENTS

The power semiconductor device in accordance with the present invention and a method for manufacturing thereof will now be described with reference to several illustrative applications and embodiments.

Although in the following description the layers and regions will be described as having certain conductivity types and being compared of certain materials, this is for illustrative purposes only. It is not intended that the invention be limited to the specific conductivity types or the specific materials referred to herein.

Figure 1:
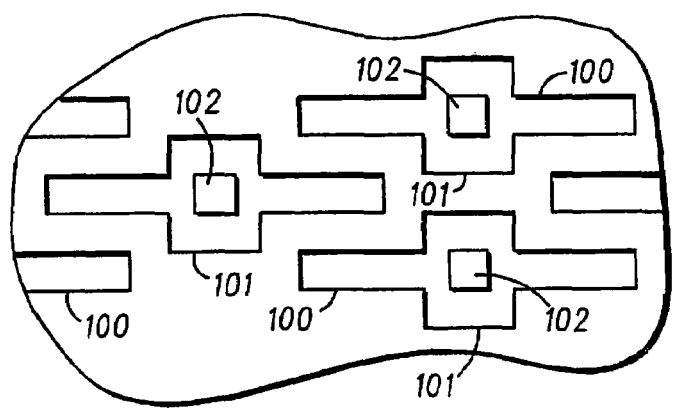
FIG. 1 shows a top view of a MOSFET device with a plurality of interrupted relatively short zig-zag polysilicon stripes gate of the prior art.
Figure 2:
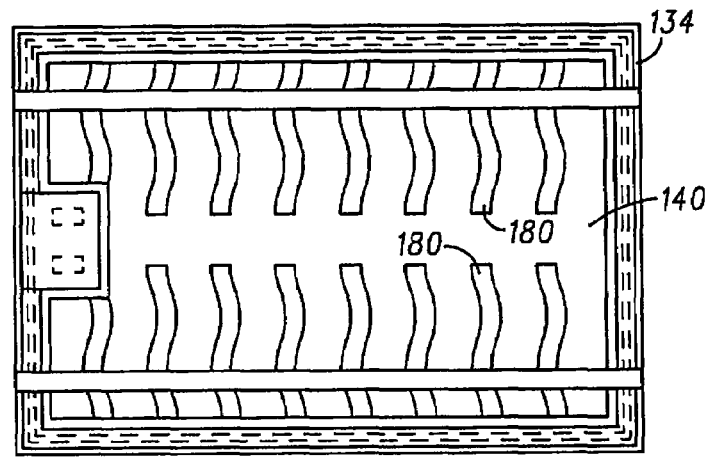
FIG. 2 shows a top view of a MOSFET device having a single base region in which the gate layer of each transistor substantially surrounds the single base region in the prior art.
Figure 3:
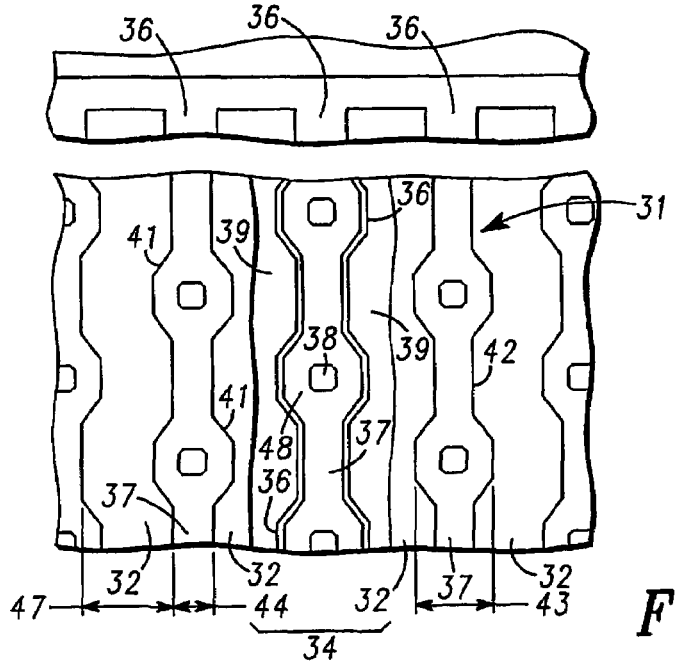
FIG. 3 shows a top view of another stripe configuration of an IGFET having improved channel density and on-state resistance in the prior art.
Figure 4:
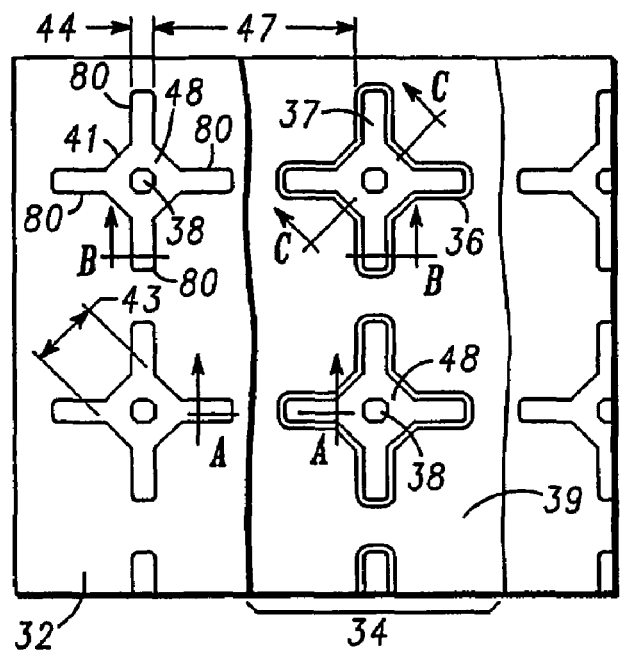
FIG. 4 shows a top view of individual cells in an embodiment with four branches arranged crosswise in a semiconductor device according to the present invention wherein the drain layer is shaped with straight segments before the merge operation.

FIG. 4 depicts in more detail a top view of individual cells with four branches arranged crosswise of a semiconductor device according to an embodiment of the present invention before the merge operation. This arrangement aims at having improved channel density and low on-state resistance.

As is shown in FIG. 4, each individual cell has two horizontal branches and two vertical branches. The four branches of each individual cell are arranged so as to have a cross shape in this particular implementation. But the four radially extending branches may be arranged differently in other implementations.

In order to provide a more complete view of the structure beneath the insulated gate region, also called polysilicon layer (32), a middle portion (34) without the insulated gate region (32) is shown in this FIG. 4. The lines shown in that middle portion (34) indicate a transition in dopant conductivity type such as from P-type to N-type or vice-versa. In that middle portion, each branch (80) of the cell includes a source region (37) within a well or base region (36).

The base region (36) is a P-conductivity doped region in a semiconductor material that is used to provide a current channel for a MOSFET or IGFET or an IGBT. The current channel is controlled by the overlying insulated gate layer (32).

A portion of a common drain region (39) is shown outside the well region (36). Instead of having a configuration where channels of individual cells are formed between the edge of source region (37) in the branches and the junction of well region (36) and common drain region (39), the semiconductor device in accordance with the present invention is configured where each individual cell is aligned to form a network with their well regions (36) connected to each other by a merge operation of adjacent PHV regions along the branches(80) underneath the insulated gate region (32). Well regions (36) referred to as the P High Voltage are also called the PHV or body regions.

Figure 5:
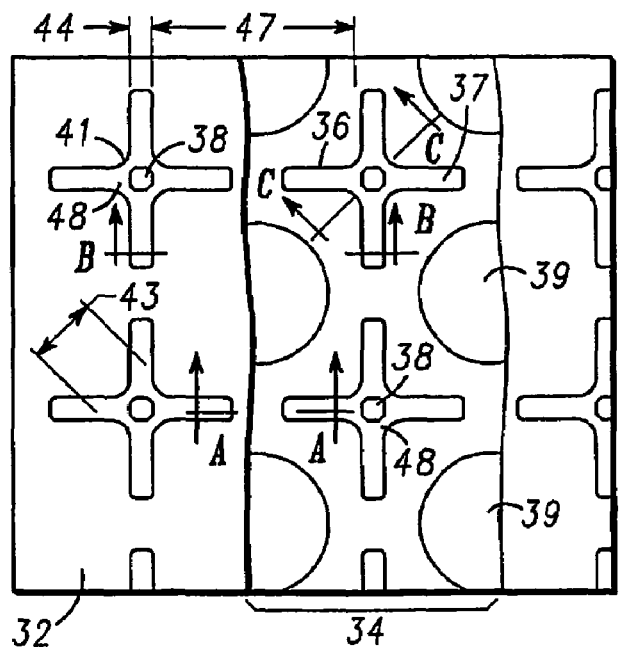
FIG. 5 shows a top view of individual cells in an embodiment with four branches arranged crosswise in a semiconductor device according to the present invention wherein the drain layer is shaped with rounded segments after the merge operation.

The four branches (80) of each individual cell have a linear shape or pattern. However, in a preferred embodiment, these branches may have a different pattern such as a non-linear shape or undulating shape. The four branches are bound to each other by four linear cut-outs (41) as is shown in FIG. 4 or four curving cut-outs as is shown in FIG. 5. By using four curving cut-outs (41) of FIG. 5, the breakdown voltage capability is increased since the curvature radius is inverted so as to get a rounded shape of the PHV body region (36). This configuration is totally different from the one in the U.S. Pat. No. 5,703,389 which discloses strip regions with a plurality of enlarged central regions wherein elongated portions radially extending from a central region resembles a 'dumb-bell' or 'dog-bone' shape.

These four branches (80) are arranged in such a way that they have a width (44) that is less than width (43) which is the widest distance between radially opposed portions of insulated gate region (32). Width (44) is the width of the source region (37) in each branch (80).

It is should be kept in mind that the structural dimensions of the individual cells depend on the voltage range. In a preferred embodiment, width (44) in each branch (80) is in the order of a few microns or in a range from approximately 1.0 to 3.5 microns and with (43) between two parallel cut-outs is approximately 0.5 to 2.0 microns greater than width (44). Each branch (80) has a length (46) less than 10.0 microns preferably with a range from 2.5 to 5.0 microns preferred. Each parallel branch (80) is spaced apart with a distance (47) in a range from approximately 3.0 to 7.0 microns with 4.0 to 5.0 micron preferred. With these dimensions, insulated gate regions (32) can be wider than the width (44) of source region (37) in each branch (80).

In the preferred embodiment, the branches (80) are preferably formed in the insulated gate region (32) after insulated gate region has been deposited onto an underlying semiconductor material. After the four branches (80) are formed, the base region or well region (36) is formed first followed by source region not only in the enlarged central area (48) but also in the branches (80). Both regions are formed by incorporating the appropriate dopants type (N-type or P-type) into the underlying semiconductor material.

The four contact cut-outs (41) surrounding an individual cell have an octagon shape with four straight cut-outs as is shown in FIG. 4. But in another implementation, these four cut-outs may have curving shapes such as concave shapes where the inverse curvature radius has the effect of increasing the breakdown voltage capability as mentioned earlier.

Although the branches (80) of each individual cell are shown with straight segments, other non-straight variations are possible such as undulated shape or zig-zag shapes. In addition, the width (44) of each branch, instead of being constant, may vary along the length of the branch. The only limitation of the width (44) of each branch is the photolithographic process capability.

Within each contact cut-out portion (41), doped contact regions (38) are implemented with a shape or geometry that maximises contact area to that central portion (48) of the source region that is within or bounded by contact cut-out portions (41). For example, doped contact regions (38) have a circular, diamond, or multi-side shape which would maximise the contact area. Optionally, doped contact regions (38) may have the same shape as contact cut-out portions (41). Doped contact region (38) is for example heavily doped P-type but generally with lighter dopant concentration than source region (37), and base or well region (36) is a more lightly doped P-type region.

The four branches (80) of each individual cell arranged cross-wise increase the channel density. But it should be kept in mind that there are many possible arrangements that could increase the channel density as well. In the configuration of four extending branches, they can be orthogonal as is shown in FIGS. 4 and 5, but they can be radially arranged with different angles as long as the individual cells form a network of connected PHV regions.

Figure 6:
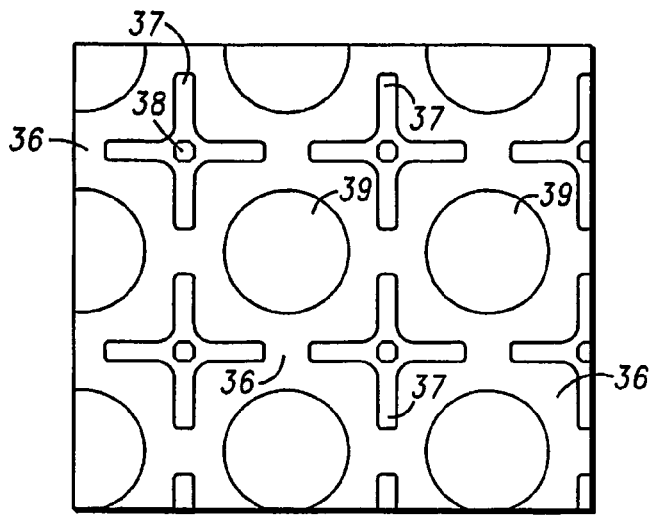
FIG. 6 shows a top view of individual cells in an embodiment with four branches after the merge operation of well or PHV regions along the branches to form a network of well regions according to the present invention after the merge operation.

FIG. 6 shows a top view of individual cells with four branches (80) arranged crosswise after the merge operation between each adjacent well region (36) along the branches to create the contact between these well regions. After the merge operation, the well or PHV regions form a network or matrix of well regions (36) whereas drain cells or drain regions (39) are physically isolated on the surface even though they have the same voltage.

In the semiconductor device in accordance with the present invention (embodiments described and shown in FIGS. 4-6), the specific cell openings drawn in the continuous polysilicon gate layer (32) form the source region (37) and well regions, which well regions (36) are merged together by diffusion and thus form a continuous well or body region (36). The merge between each adjacent well or PHV regions (36) of each branch creates the contact between these wells using a common doped region to form a network or matrix of well or PHV regions (36). The network or matrix of PHV or well regions formed is therefore composed of rounded shapes which separate the eight branches (four horizontal and four vertical branches) of four adjacent individual cells. This explanation will be more explicit with the following FIGS. 7 and 8.

Figure 7:
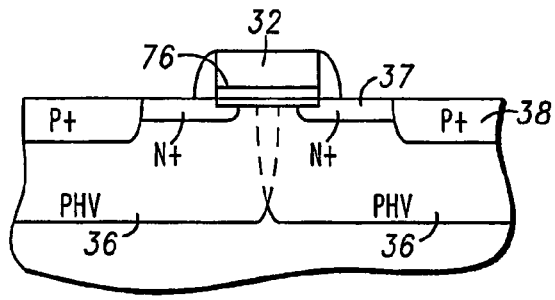
FIG. 7 represents a simplified cross-sectional view of a portion of a semiconductor device taken along line A-A of FIG. 4 showing the merged PHV regions.

FIG. 7 represents a simplified cross-sectional view of a portion of a semiconductor device taken along line A-A of FIG. 4 or between two horizontal branches of two adjacent individual cells. The different layers are not represented except those that are relevant to show the merged PHV regions resulting from the merging process of the PHV or well regions of each of the adjacent horizontal branches. The merge of the PHV regions at high temperature creates the contact between all PHV regions of all branches so as to form the matrix of merged PHV regions having rounded shape or octagon shape with unequal side lengths. By having merged well or PHV regions, the phenomenon of parasitic NPN or PNP bipolarity (also called snap back effect) is avoided since the base region will always be polarised, which is a major improvement. Thus, the breakdown voltage is improved as well as the Unclamped Inductive Switching (UIS) such that the voltage and the current circulating between the individual cells can be sustained at a higher level.

Two international patent applications WO 01/31711 and WO 01/31709 report a single well/PHV region made by layout where either the gate layer substantially surrounds the base region or the base region substantially surrounds the gate layer of the transistor. The continuity of the base regions disclosed therein is provided by interior base regions which are connected to each other by base branches separated by gate feeds. In comparison with the configuration disclosed in these two prior art documents, the present invention differs in two points. First, no gate feed is necessary to uniformly power the MOSFET in the present invention, which represents an important economy of space and a drastic reduction of the $R_{DSON}$ of about 15%. Second, a merge or diffusion between adjacent branches of adjacent individual cells according to the present invention creates the contact between the well or PHV regions of all individual cells so as to form a continuous well or PHV region.

This merge or diffusion is achieved by a process parameter optimisation in conjunction with the actual layout without requiring any extra mask layers. The merge or diffusion operation is performed in two steps: the implant of the PHV and the merge or diffusion itself.

The implant of the PHV or the well region requires the use of a correct doping dose. Once this step is completed, the process of merge or diffusion can start involving 2 parameters: time and temperature. For a merge or diffusion which lasts between 1 to 2 hours at 1100° C., the structural dimensions of the individual cells are such that for instance width (44) in each branch is in the order of a few microns between 1.0 to 3.5 microns. Each one of the independent parameters can be changed in order to obtain a different structural dimension. To some extent, the doping dose employed during the implant of the PHV will also affect on the structural dimensions of the individual cells. A man skilled in the art can independently change these three parameters in order to obtain the expected structural dimensions of the individual cells.

In a preferred embodiment, instead of using masking and diffusion to obtain a single body region (36), one can add another masking and implant step to merge the adjacent body regions of adjacent individual cells. This enables more flexibility in the choice of the width of the contact regions of the cells and, particularly in the case of high stand-off voltage devices, enables the contact regions to be formed merged with a high level of uniformity and well rounded corners at the juxtaposed ends of the adjacent cell branches without needing a further drive (or lateral diffusion) step.

Figure 8:
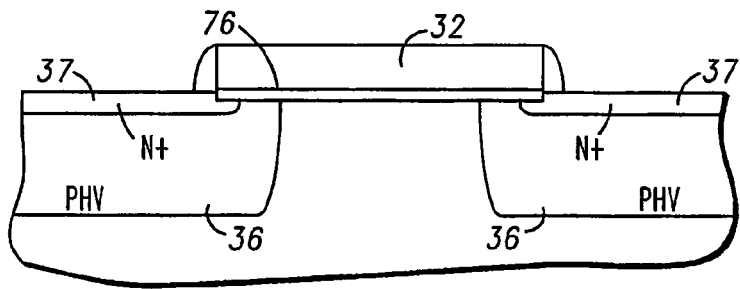
FIG. 8 represents a simplified cross-sectional view of a portion of a semiconductor device taken along line B-B of FIG. 4.

FIG. 8 represents a simplified cross-sectional view of a portion of a semiconductor device taken along line B-B of FIG. 4. This figure shows that the merging process only occurs adjacent and between the juxtaposed ends of each two adjacent branches (80) of two adjacent individual cells as shown in FIG. 7 whereas along line B-B which is between two opposite and parallel branches of 2 adjacent individual cells, there is no contact between the PHV regions. The case shown is between two vertical branches, but it will be the same between two horizontal, opposite and parallel, branches.

Figure 9:
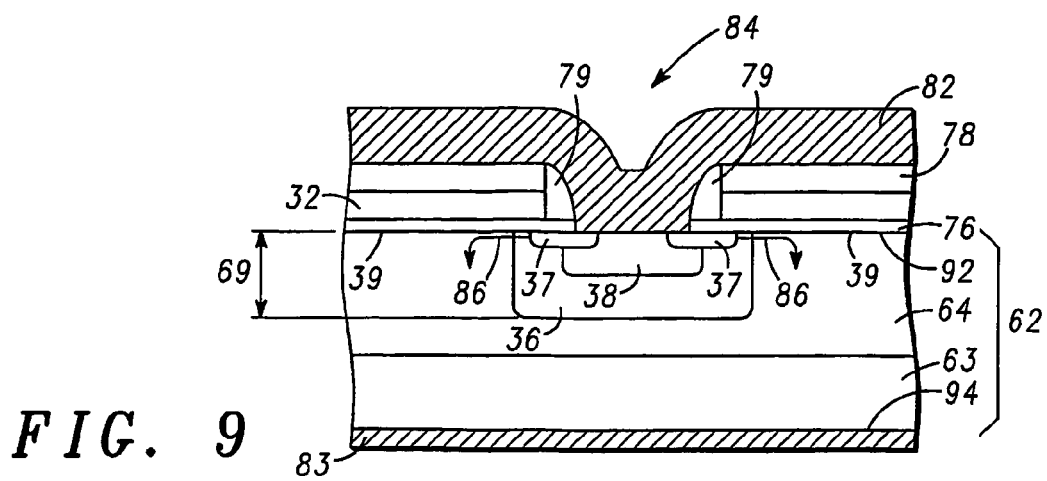
FIG. 9 represents a detailed cross-sectional view of a portion of a semiconductor device taken along line C-C of FIG. 4 with the different layers.

FIG. 9 represents a detailed cross-sectional view of a portion of a semiconductor device taken along line C-C of an individual cell showing the additional layers that have been formed for a finished MOSFET device.

As is shown in this figure, the MOSFET device includes a drain electrode (83), a semiconductor substrate (62) having a first surface (92) and second surface (94) parallel to the first surface and is configured to conduct current from the first surface to the second surface.

Substrate (62) typically includes a first substrate (63) having a high dopant concentration and a doped layer (64) formed on the first substrate (63). Doped layer (64) is of the same conductivity type as the first substrate (63), but is more lightly doped. For example, in a N-channel MOSFET device, the first substrate (63) and doped layer (64) have an N-type conductivity. In a P-channel MOSFET device, the first substrate (63) and doped layer (64) have a P-type conductivity. Doped layer (64) has a dopant concentration that depends on the desired breakdown voltage characteristics of the finished device. Typically, doped layer (64) has preferably a thickness of a few microns but can be in a range from approximately 1.0 to 10.0 microns. Doped layer (64) is formed using well-known techniques. That portion of doped layer (64) around and below well or PHV region (36) is common drain region (39).

On a surface of substrate (62), a well or PHV region (36) is formed and extends to a depth (69) into substrate (62). Well or PHV region (36) is doped with a dopant having opposite conductivity type than doped layer (64). For example, in a N-channel MOSFET device, well or PHV region (36) has a P-type conductivity. In a P-channel MOSFET device, well or NHV region (36) has an N-type conductivity. As mentioned earlier, NHV or PHV region (36) typically is referred to as the 'high voltage' region because of its breakdown characteristics. In a typical device, NHV or PHV region has a doping surface with a depth (69) of about a micron or in the range of 1 micron.

Within well or PHV region (36), source regions (37) in the branches and in the central area (48) are formed and extended to a depth less than depth (69). Source regions typically have a depth in a range from 0.15 to 0.25 microns. Along line C-C of FIG. 4, source region is illustrated as having two portions within well or PHV region (36) because the cross-section is taken through the centre of one of contact cut-out portions (41). Source region (37) is doped with a dopant having the same conductivity type as doped layer (64) and the first substrate (63).

Within contact cut-out portions (41), doped contact regions (38) are formed and extend into well or PHV region (36) to a depth of less than a micron or in a range order of less than one micron. Doped contact regions (38) are doped with a dopant having the same conductivity type as well or PHV region (36), but are doped to a higher dopant concentration than well or PHV region (36).

Gate oxide layer (76) is formed over a portion of source region of the central area (48), a portion of well or PHV region (36), and doped layer (64). Gate oxide layer (76) typically comprises a silicon oxide, has a thickness of several hundreds of angstroms depending on the operating voltage, and is formed using well-known techniques. By using well-known processing techniques, insulated gate region (32) is formed over gate oxide layer (76) and typically comprises a doped polycrystalline semiconductor material such as polysilicon.

By using well-known techniques, additional layers (78) are formed over insulated gate region (32) and typically comprise a dielectric such as silicon oxide. Optionally, these additional layers (78) comprises a multilayer such as a silicon nitride layer formed on insulated gate region (32) and a silicon oxide layer formed on the silicon nitride layer.

Preferably, gate oxide layer (76), insulated gate region (32), and additional layer (78) are formed on substrate (62). Well or PHV region (36) is then formed in doped layer (64) followed by source regions (37) in the branches (80), using the layers produced as mask, as well as in the central area (48) and then doped contact region (38). Well or PHV region (36), source regions (37) and doped contact regions (38) are formed using, for example, ion implantation techniques.

A source ohmic layer or source electrode (82) is formed over the additional layer (78) and contacts source region (37) and doped region (38). By using well-know techniques, spacer regions (79) isolate source ohmic layer (82) from insulated gate region (32). Spacer regions (79) typically comprise a silicon oxide. For example, spacer regions (79) are formed by depositing a silicon oxide layer followed by a masked etching process to provide the structure as is shown in this figure. Preferably, an unmasked etching process is used to form spacer regions (79). Such a process is commonly referred to as a space alignment process.

Source ohmic layer (82) typically comprises aluminium or an aluminium alloy. A passivation layer (84) is formed on top of the MOSFET device.

Common drain ohmic layer or drain electrode (83) is formed over the second surface of substrate (62) and typically comprises a multilevel metallisation such as titanium/nickel/silver or the like. Arrows (86) show more clearly how current flows from source region (37) into common drain region (39) then to drain with an angle of 45 degree (not shown on the figure) to drain electrode (83).

It is understood that the cross-sectional configuration of well or PHV regions (36) can be modified to further enhance breakdown voltage characteristics of MOSFET devices without departing from the scope of the present invention.

It should however be recognised that the configuration of individual cells with four crossed branches (80) according to the present invention increases the channel density thereby lowers the on-state resistance which is mainly due to the reduced size of the source region.

Improvements and modifications of the shape of the four branches (80) of each individual cell arranged cross-wise may be incorporated without departing from the scope of the present invention. These branches may have different form as long as the contact regions of adjacent branch of the adjacent individual cells can merge at and adjacent juxtaposed ends of the respective branches so as to create the contact between the PHV or well regions of the adjacent branches and form a single and substantially uniformly doped base region (36) surrounding the source regions of the individual cells of the array.

In another configuration of individual cells with three branches, the merged and interconnected PHV or well regions of adjacent branches form a network with hexagonal drain regions (39), like a honey comb. A representation of such a configuration can be easily obtained based on the specifications mentioned earlier. The simplified cross-sectional views of this configuration are exactly the same as those on FIGS. 7 and 8.

As a result of such configuration, the three contact cut-outs (41) surrounding an individual cell have a hexagon shape with three straight cut-outs. These three cut-outs may also have curving shapes such as concave shapes with the effect of increasing the breakdown voltage capability as mentioned earlier.

The present invention can also be implemented in a configuration of more than four branches. For instance, in the configuration of individual cells with six branches, an arrangement is obtained where the merged and interconnected PHV or well regions of adjacent branches form a network with triangular drain regions (39). In the same way, a representation of such a configuration can be easily obtained based on the specifications mentioned earlier, and the simplified cross-sectional views of this configuration are exactly the same as those on FIGS. 7 and 8.

Additional improvements and modifications of the configuration of the specific embodiments described herein may be incorporated without departing from the scope of the present invention.

The invention claimed is:

1. A method for manufacturing a power semiconductor device comprising
forming a two-dimensional array of individual cells from a first surface of a semiconductor substrate, each individual cell having source regions within a single and substantially uniformly doped base region surrounding said source regions of the individual cells of said array, and
forming a patterned insulated gate region at said first surface, wherein the source regions of the individual cells of the array comprise a plurality of source region branches each extending towards at least one source region branch of an adjacent cell, the source region branches of adjacent cells presenting juxtaposed ends, wherein forming said single and substantially uniformly doped base region comprises the steps of:
using said patterned insulated gate region in forming a plurality of base region branches extending radially towards at least one base region branch of an adjacent cell to present juxtaposed base region ends,
subsequently merging together the base region branches of adjacent cells adjacent and between said juxtaposed base region ends to form said single and substantially uniformly doped base region.

2. The method for manufacturing a power semiconductor device according to claim 1, wherein the device comprises at least one drain electrode contacting a face of said semiconductor substrate opposite said source regions.

3. The method for manufacturing a power semiconductor device according to claim 2, wherein the device comprises physically isolated drain regions in the substrate and wherein said physically isolated drain regions have a depth equivalent to the depth of said base regions.

4. The method for manufacturing a power semiconductor device as claimed in claim 1 comprising the steps of:
using said patterned insulated gate region in forming said source region within each base region of each individual cell with said radially extending source region branches corresponding to said base region branches.

5. The method of manufacturing a power semiconductor device according to claim 1 wherein forming said base regions comprises a step of using said patterned insulated gate region in making ion implant of high voltage breakdown resistance for the base region branches before merging together the base region branches.

6. The method of manufacturing a power semiconductor device according to claim 1, wherein forming said base region comprises the step of causing the base region branches of adjacent cells to diffuse laterally of the array so as to merge together adjacent and between said juxtaposed ends.

7. The method of manufacturing a power semiconductor device according to claim 1, wherein said source regions are formed after merging said base region branches.

* * * * *